US009429790B2

(12) United States Patent
Kashima et al.

(10) Patent No.: US 9,429,790 B2
(45) Date of Patent: Aug. 30, 2016

(54) ARRAY SUBSTRATE AND LIQUID CRYSTAL DISPLAY DEVICE

(71) Applicant: BOE Technology Group Co., Ltd., Beijing (CN)

(72) Inventors: Miki Kashima, Beijing (CN); Teruaki Suzuki, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 165 days.

(21) Appl. No.: 13/980,507

(22) PCT Filed: Dec. 21, 2012

(86) PCT No.: PCT/CN2012/087180
§ 371 (c)(1),
(2) Date: Jul. 18, 2013

(87) PCT Pub. No.: WO2014/005411
PCT Pub. Date: Jan. 9, 2014

(65) Prior Publication Data
US 2014/0078435 A1 Mar. 20, 2014

(30) Foreign Application Priority Data

Jul. 3, 2012 (CN) .......................... 2012 1 0229506

(51) Int. Cl.
*G02F 1/1335* (2006.01)
*H01L 27/12* (2006.01)
*G02F 1/1362* (2006.01)

(52) U.S. Cl.
CPC ..... *G02F 1/133528* (2013.01); *G02F 1/13362* (2013.01); *G02F 1/133602* (2013.01); *H01L 27/1214* (2013.01); *G02F 1/1362* (2013.01); *G02F 2201/44* (2013.01)

(58) Field of Classification Search
CPC ........... G02F 1/13362; G02F 2201/44; G02F 1/133602; G02F 1/133528; H01L 27/3232; H01L 27/1214
USPC ..................................... 349/69, 113
See application file for complete search history.

(56) References Cited

U.S. PATENT DOCUMENTS

| 2003/0193457 A1* | 10/2003 | Wang ........................ G09G 3/20 345/84 |
| 2006/0007373 A1* | 1/2006 | Arai et al. ..................... 349/113 |

(Continued)

FOREIGN PATENT DOCUMENTS

| CN | 2881703 Y | 3/2007 |
| CN | 101097379 A | 1/2008 |

(Continued)

OTHER PUBLICATIONS

De-Xi et al., Green polarized electroluminescence from poly (9, 9-dioctyfluorene-alt-benzothiadiazole, Chin. Phys. Soc., Mar. 2009, pp. 2067-2071, vol. 58, No. 3.

(Continued)

*Primary Examiner* — Nathanael R Briggs
(74) *Attorney, Agent, or Firm* — Ladas & Parry LLP

(57) ABSTRACT

An array substrate and a liquid crystal display device are provided. The array substrate (11) comprises a first substrate (110) and a switch element (112) disposed on an inner side of the first substrate (110), and further comprises a polarizing light-emitting layer (111), the polarizing light-emitting layer (111) has an EL mode. In the liquid crystal display device (1), the polarizing light-emitting layer (111) with an EL mode is disposed in the array substrate (11), therefore, no backlight is required and the power consumption of the liquid crystal display device (1) is further reduced.

18 Claims, 2 Drawing Sheets

(56) References Cited

U.S. PATENT DOCUMENTS

| | | | |
|---|---|---|---|
| 2006/0114371 A1* | 6/2006 | Peterson | G02F 1/133617 349/61 |
| 2006/0261337 A1* | 11/2006 | Koma | 257/59 |
| 2008/0001524 A1 | 1/2008 | Lee et al. | |
| 2008/0002079 A1* | 1/2008 | Kimura | G02B 6/0051 349/42 |
| 2011/0037916 A1* | 2/2011 | Furukawa | H01L 27/3274 349/46 |

FOREIGN PATENT DOCUMENTS

| CN | 10142486 A | 5/2009 |
|---|---|---|
| CN | 101424846 A | 5/2009 |
| CN | 102749778 A | 10/2012 |
| JP | 2007-066857 | 3/2007 |

OTHER PUBLICATIONS

First Office Action issued by the Chinese Patent Office for Chinese Patent Application No. 2012102295060 dated May 5, 2014, 7pgs.

English translation of First Office Action issued by the Chinese Patent Office for Chinese Patent Application No. 2012102295060 dated May 5, 2014, 4pgs.

International Search Report for International Application No. PCT/CN2012/087180, 13pgs.

International Preliminary Report on Patentability issued by the International Bureau of WIPO on Jan. 6, 2015 for International Application No. PCT/CN2012/087180; 6 pages.

* cited by examiner

ARRAY SUBSTRATE AND LIQUID CRYSTAL DISPLAY DEVICE

CROSS REFERENCE TO RELATED APPLICATIONS

This application is based on International Application No. PCT/CN2012/087180 filed on Dec. 21, 2012, which claims priority to Chinese National Application No. 201210229506.0, filed on Jul. 3, 2012, the contents of which are incorporated herein by reference.

FIELD OF THE ART

The present invention relates to an array substrate and a liquid crystal display (LCD) device.

BACKGROUND

With the ever developing of technologies, consumers are expecting more and more from LCD devices. Based on the light source used in the LCD, LCD devices may be classified into transmissive LCDs, reflective LCDs and transflective LCDs, among which transmissive LCDs are currently the most widely used in the display devices. The transmissive LCD devices display images using a backlight source, which is quite power consuming, thus making the power consumption of the entire LCD device high. In view of the above, most manufacturers are concerned with the issue of reducing the power consumption of LCD devices.

SUMMARY

Embodiments of the invention provide an array substrate and a LCD device. A polarizing light-emitting layer with a luminescence mode is disposed in the array substrate, therefore, no backlight is required for the LCD device, and the power consumption of the LCD device is further reduced.

An aspect of the invention provides an array substrate comprising a first substrate and a switch element disposed on an inner side of the first substrate, wherein the array substrate further comprises: a polarizing light-emitting layer disposed on the first substrate, wherein the polarizing light-emitting layer has an electroluminescence mode.

As an example, the array substrate further comprises a first transparent electrode connected to the switch element.

As an example, the polarizing light-emitting layer is in contact with the first transparent electrode.

As an example, the array substrate further comprises a second transparent electrode.

As an example, the polarizing light-emitting layer is in contact with the first or the second transparent electrode.

As an example, the switch element is a thin film transistor (TFT).

As an example, the switch element and the first transparent electrode are disposed on the polarizing light-emitting layer.

As an example, the array substrate further comprises an insulating layer disposed between the polarizing light-emitting layer and the switch element as well as the first transparent electrode.

As an example, the array substrate further comprises an insulating protection layer disposed between the first transparent electrode and the second transparent electrode.

As an example, the array substrate further comprises a common electrode located in the same layer as the first transparent electrode and connected to a common electrode line.

As an example, a horizontal electric field is generated between the common electrode and the first transparent electrode.

Another aspect of the invention provides a LCD device comprising a color filter substrate and an array substrate of any of the above examples disposed parallel to each other, and liquid crystals filling between the color filter substrate and the array substrate.

As an example, the color filter substrate comprises: a black matrix, a color filter layer and a third transparent electrode, where the black matrix has a plurality of aperture regions, the color filter layer is formed in the aperture regions of the black matrix, and the third transparent electrode is formed on the black matrix and the color filter layer.

As an example, a polarizer is attached to the outer side of the color filter substrate.

As an example, the alignment axis of the polarizing light-emitting layer is parallel with or vertical to the polarization axis of the polarizer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

It is noted that "on," "under," "inside," "outside" and the like are used to illustrate the invention and should not be considered as limitative.

Figure 1:
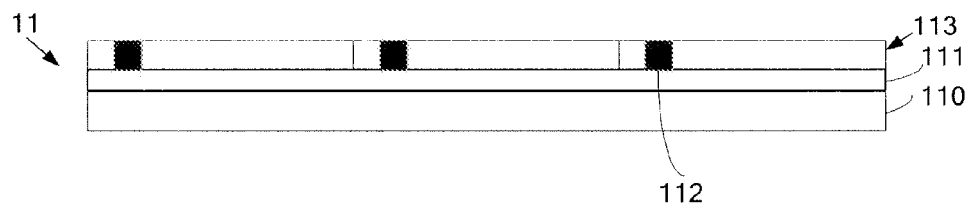
FIG. 1 schematically illustrates a first configuration of an array substrate in accordance with the invention.

An embodiment of the invention provides an array substrate 11 as shown in FIG. 1, which comprises a first substrate 110, a switch element 112 disposed on the inner side of the first substrate 110. The array substrate further comprises:

A polarizing light-emitting layer 111 disposed on the first substrate 110, wherein the polarizing light-emitting layer 111 has an electroluminescent (EL) mode.

The polarizing light-emitting layer 111 will be described in more detail here.

The polarizing light-emitting layer 111 in accordance with the embodiment of the invention is made of a polarizing light-emitting material which is a liquid crystalline compound having an Oligothiophenes skeleton. Such compound may be organized into a columnar liquid crystalline phase, thereby providing a single axis alignment film, which is the polarizing light-emitting layer 111 described in the embodiment of the invention. The polarizing light-emitting material is a material that emits light under the excitation of a voltage and has a strong light intensity. Thus, the polarizing light-emitting layer 111 has an EL mode.

Electroluminescence is a physical phenomenon in which a polarizing light-emitting material emits light in response to an electron in the material excited by a voltage striking the luminescence centre and causing transition, change and recombination of the electron energy level.

Furthermore, the array substrate 11 further comprises a first transparent electrode layer 113 connected to the switch element 112. More specifically, the first transparent electrode layer 113 comprises a plurality of transparent electrodes, each of which is connected to a switch element 112. Here the transparent electrodes are generally referred to as pixel electrodes.

Moreover, the polarizing light-emitting layer 111 is in contact with the first transparent electrode layer 113. As a result, a voltage applied to the polarizing light-emitting layer 111 may be provided through a data line supplying power to the first transparent electrode layer 113.

As an example, the array substrate as illustrated in FIG. 1 comprises:

A first substrate 110, where the first substrate 110 is a transparent substrate, the material of which may be, but not limited to glass, quartz, or transparent resin;

A polarizing light-emitting layer 111 formed on the first substrate 110, where the polarizing light-emitting layer 111 has an EL mode;

A switch element 112 formed on the polarizing light-emitting layer 111;

A first transparent electrode layer 113 formed on the polarizing light-emitting layer 111, where the first transparent electrode layer 113 is connected to the switch element 112. More specifically, a plurality of transparent electrodes (pixel electrodes) contained in the first transparent electrode layer 113 are connected to the switch elements 112 respectively. Moreover, the polarizing light-emitting layer 111 is in contact with the first transparent electrode layer 113.

In such a way, the first transparent electrode layer 113 may generate a vertical electric field together with a third transparent electrode layer in a color filter substrate, thereby making the liquid crystals to rotate.

Figure 2:
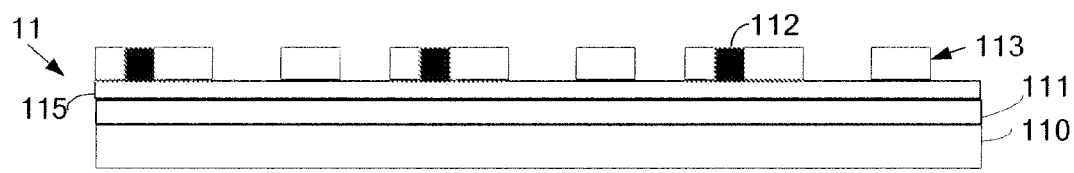
FIG. 2 schematically illustrates a second configuration of an array substrate in accordance with the invention.

As another example, an array substrate 11 as illustrated in FIG. 2 comprises:

A first substrate 110, where the first substrate 110 is a transparent substrate, the material of which may be, but not limited to glass, quartz, or transparent resin;

A polarizing light-emitting layer 111 formed on the first substrate 110, where the polarizing light-emitting layer 111 has an EL mode;

An insulating layer 115 formed on the polarizing light-emitting layer 111, where the polarizing light-emitting layer 111 is individually connected to a power which supplies a voltage to the polarizing light-emitting layer 111 to excite the light;

A Switch element 112 formed on the insulating layer 115;

A first transparent electrode layer 113 formed on the insulating layer 115, where the first transparent electrode layer 113 comprises two electrodes, one of which is referred to as a pixel electrode and is connected to the switch element 112, the other is referred to as a common electrode and is connected to a common electrode line.

In such a way, the two electrodes in the first transparent electrode layer 113 may generate a horizontal electric field that rotates or deforms the liquid crystals, as a result, no transparent electrode layer is needed for the color filter substrate.

Moreover, the array substrate 11 further comprises a second transparent electrode layer 114.

Moreover, the polarizing light-emitting layer 111 is in contact with the first transparent electrode layer 113 or the second transparent electrode layer 114.

Figure 3:
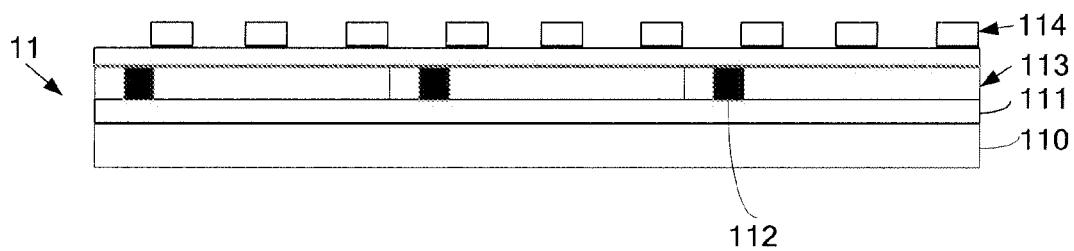
FIG. 3 schematically illustrates a third configuration of an array substrate in accordance with the invention.

A configuration of the array substrate 11 will be described in connection with FIG. 3 in which the polarizing light-emitting layer 111 is in contact with the first transparent electrode layer 113 as an example. The array substrate 11 comprises:

A polarizing light-emitting layer 111 formed on the first substrate 110, where the polarizing light-emitting layer 111 has an EL mode;

A switch element 112 formed on the polarizing light-emitting layer 111;

A first transparent electrode layer 113 formed on the polarizing light-emitting layer 111, where the first transparent electrode layer 113 is connected to the switch element 112. More specifically, a plurality of transparent electrodes (pixel electrodes) contained in the first transparent electrode layer 113 are connected to the switch element 112 respectively, and the polarizing light-emitting layer 111 is in contact with the first transparent electrode layer 113.

A second transparent electrode layer 114 formed on the first transparent electrode layer 113 and connected to a common electrode line, where an insulating protection layer is disposed between the first transparent electrode layer 113 and the second transparent electrode layer 114, such that the first transparent electrode layer 113 and the second transparent electrode layer 114 are not electrically connected.

In such a way, a horizontal electric field is generated by applying a voltage to the first transparent electrode layer 113 and the second transparent electrode layer 114 to rotate or deform the liquid crystals, therefore, no transparent electrode layer is needed for the color filter substrate.

Furthermore, the switch element 112 is a thin film transistor (TFT).

Figure 4:
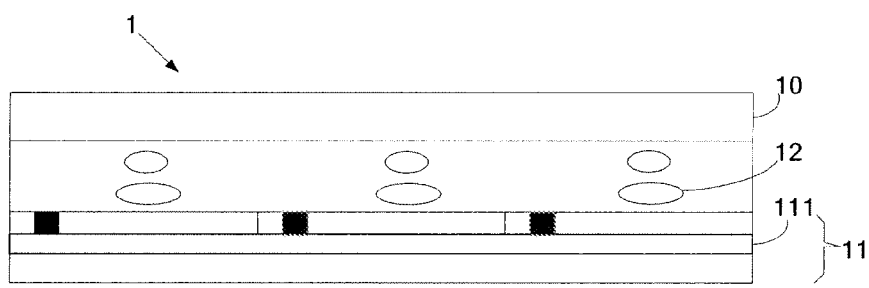
FIG. 4 schematically illustrates a first configuration of an LCD device in accordance with the invention.

As shown in FIG. 4, the LCD device 1 in accordance with an embodiment of the invention comprises: a color filter substrate 10 and the afore-mentioned array substrate 11 disposed parallel to each other, and liquid crystals 12 filling the space between the color filter substrate 10 and the array substrate 11.

As an example, the liquid crystals 12 may have a Twisted Nematic (TN) mode. Thus, the liquid crystals 12 may rotate a polarization of an incident light by 90 degrees when no voltage is applied.

Figure 5:
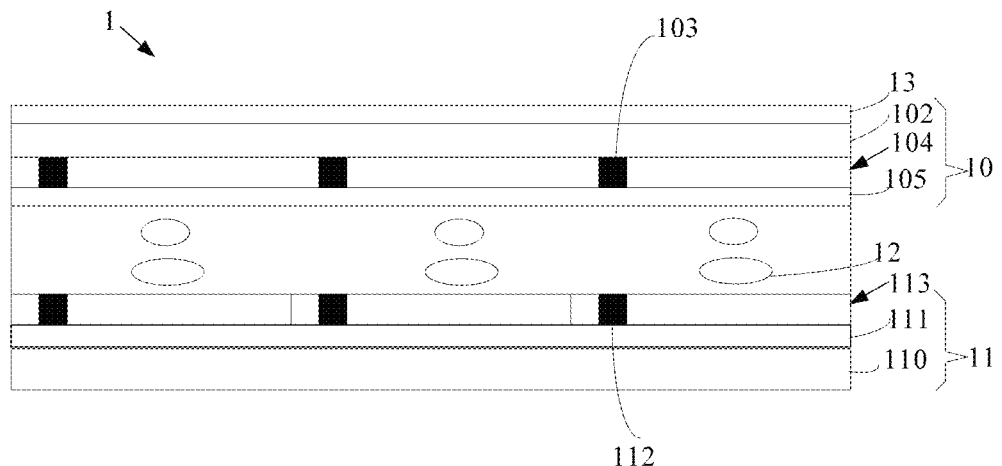
FIG. 5 schematically illustrates a second configuration of an LCD device in accordance with the invention.

As an example, the color filter substrate 10 as shown in FIG. 5 comprises:

A second substrate 102 which is a transparent substrate and the material of which may be, but not limited to glass, quartz, or transparent resin;

A black matrix 103 and a color filter layer 104 formed on the second substrate 102, where the black matrix 103 has a plurality of aperture regions and the color filter layer 104 is formed in the aperture regions of the black matrix 103;

A third transparent electrode layer 105 formed on the black matrix 103 and the color filter layer 104.

Moreover, a polarizer 13 is attached to the outer side of the color filter substrate 10.

Moreover, the alignment axis of the polarizing light-emitting layer 111 is parallel or vertical to the polarization axis of the polarizer 13.

Figure 6:
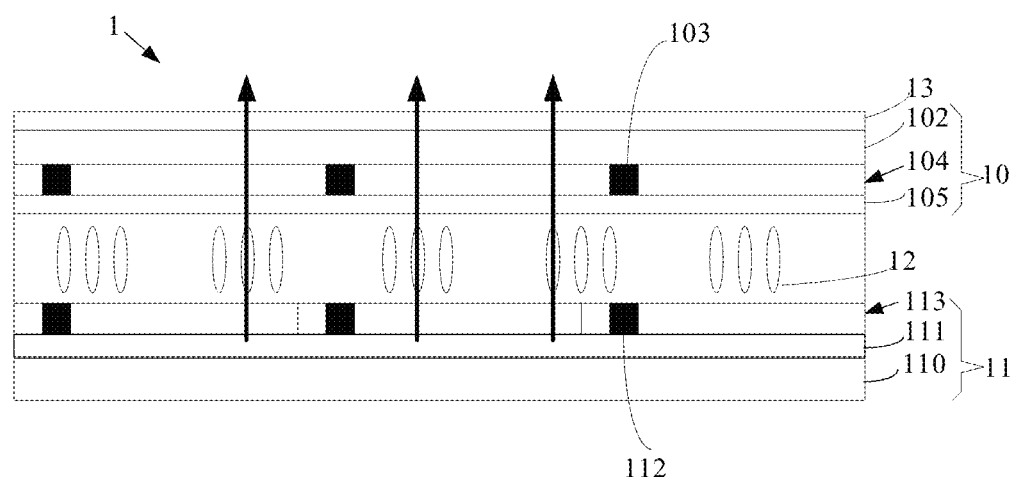
FIG. 6 schematically illustrates a third configuration of an LCD device in accordance with the invention.

In the following, an example in which the alignment axis of the polarizing light-emitting layer 111 is parallel to the polarization axis of the polarizer 13 and the LCD device 1 comprises the first transparent electrode layer 113 and the third transparent electrode layer 105 will be described. The LCD device 1 in accordance with the embodiment of the invention may present three states as follows:

(1) As shown in FIG. 5, the LCD device 1 presents a dark state when the polarizing light-emitting layer 111 is not excited by the voltage;

(2) Still referring to FIG. 5, when the polarizing light-emitting layer 111 is excited by the voltage while no voltage is applied to the first and third transparent electrode layers 113 and 105, the polarizing light-emitting layer 111 emits light vibrating along its alignment axis. Due to the TN mode of the liquid crystals 12, the polarization of the light arriving at the liquid crystals 12 is rotated by 90 degrees. When the light further arrives at the polarizer 13, it will not pass through the polarizer 13 due to the vibration direction of the light is vertical to the polarization axis of the polarizer 13. Therefore, the LCD device 1 presents a dark state;

(3) As shown in FIG. 6, when the polarizing light-emitting layer 111 is excited by the voltage and a voltage is applied to the first and the third transparent electrode layers 113 and 105, the polarizing light-emitting layer 111 emits light vibrating along its alignment axis (indicated by the arrows in FIG. 6). The liquid crystals 12 are affected by the electric field generated by the first and the third transparent electrode layers 113 and 105 and are aligned along the direction of the electric fields (vertical alignment as shown in FIG. 6). The polarization of the light will not change when transmitting through the liquid crystals 12, thus the light passes through the liquid crystals 12 directly. When the light further arrives at the polarizer 13, it will pass through the polarizer 13 since the vibration direction of the light is still parallel to the polarization axis of the polarizer 13. Therefore, the LCD device 1 presents a bright state.

An example similar to the case where the alignment axis of the polarizing light-emitting layer being parallel to the polarization axis of the polarizer will be described. In this example, the alignment axis of the polarizing light-emitting layer is vertical to the polarization axis of the polarizer and the LCD device 1 comprises the first transparent electrode layer and the second transparent electrode layer. Based on that, the LCD device may present three states as follows:

(1) The LCD device presents a dark state when the polarizing light-emitting layer is not excited by the voltage;

(2) When the polarizing light-emitting layer is excited by the voltage while no voltage is applied to the first and the second transparent electrode layers, the polarizing light-emitting layer emits light vibrating along its alignment axis. Since the liquid crystals have a horizontal electric field mode, the polarization of the light will not change when arriving at the liquid crystals. When the light further arrives at the polarizer, it will not pass through the polarizer due to the vibration direction of the light is vertical to the polarization axis of the polarizer. Therefore, the LCD device presents a dark state.

(3) When the polarizing light-emitting layer is excited by the voltage and a voltage is applied to the first and the second transparent electrode layers, the polarizing light-emitting layer emits light vibrating along its alignment axis. The liquid crystals are affected by the electric field generated by the first and the second transparent electrode layers and are aligned along the direction of the electric field. The polarization of the light changes when transmitting through the liquid crystals. When the light further arrives at the polarizer, it can pass through the polarizer 13 and the LCD device presents a bright state.

The LCD device provided by the embodiments of the invention may be a product having a display function, such as a LCD display, a LCD television, a digital photo frame, a mobile phone, a tablet PC and the like, which will not be considered as limitative to the invention.

In the LCD device provided by the embodiments of the invention, the array substrate is provided with the polarizing light-emitting layer that has the EL mode, namely, it emits light when excited by the voltage. The implementation of the polarizing light-emitting layer having the EL mode eliminates the need of the backlight in the LCD device according to the invention and thereby reducing the power consumption of the LCD device.

What are described above is related to the illustrative embodiments of the disclosure only and not limitative to the scope of the disclosure; the scopes of the disclosure are defined by the accompanying claims.

What is claimed is:

1. An array substrate comprising a first substrate and a switch element disposed on the inner side of the first substrate, wherein the array substrate further comprises:
   a polarizing light-emitting layer disposed on the first substrate, wherein the polarizing light-emitting layer has an electroluminescence mode;
   a first transparent electrode connected to the switch element;
   second transparent electrode; and
   an insulating protection layer disposed between the first transparent electrode and the second transparent electrode.

2. The array substrate according to claim 1, wherein the polarizing light-emitting layer is in contact with the first transparent electrode.

3. The array substrate according to claim 1, wherein the polarizing light-emitting layer is in contact with the first or the second transparent electrode.

4. The array substrate according to claim 1, wherein the switch element is a thin film transistor.

5. The array substrate according to claim 1, wherein the switch element and the first transparent electrode are disposed on the polarizing light-emitting layer.

6. The array substrate according to claim 1, further comprising an insulating layer disposed between the polarizing light-emitting layer and the switch element as well as the first transparent electrode.

7. The array substrate according to claim 1, further comprising a common electrode located in the same layer as the first transparent electrode and connected to a common electrode line.

8. The array substrate according to claim 7, a horizontal electric field is generated between the common electrode and the first transparent electrode.

9. A liquid crystal display (LCD) device comprising a color filter substrate, an array substrate of claim 1 disposed parallel to each other, and liquid crystals filling between the color filter substrate and the array substrate.

10. The LCD device according to claim 9, wherein the color filter substrate comprises:
    a black matrix, a color filter layer and a third transparent electrode, wherein the black matrix has a plurality of aperture regions, the color filter layer is formed in the aperture regions of the black matrix, and the third transparent electrode is formed on the black matrix and the color filter layer.

11. The LCD device of claim 9, wherein a polarizer is attached to the outer side of the color filter substrate.

12. The LCD device of claim 11, wherein the alignment axis of the polarizing light-emitting layer is parallel or vertical to the polarization axis of the polarizer.

13. The LCD device of claim 10, wherein a polarizer is attached to the outer side of the color filter substrate.

14. The array substrate according to claim 2, wherein the switch element and the first transparent electrode are disposed on the polarizing light-emitting layer.

15. The array substrate according to claim 1, wherein the switch element and the first transparent electrode are disposed on the polarizing light-emitting layer.

16. The array substrate according to claim 3, wherein the switch element and the first transparent electrode are disposed on the polarizing light-emitting layer.

17. The array substrate according to claim 4, wherein the switch element and the first transparent electrode are disposed on the polarizing light-emitting layer.

18. An LCD display device comprising:
an array substrate comprising:
   a first substrate;
   a plurality of switch elements disposed on the inner side of the first substrate;
   a polarizing light-emitting layer disposed on the first substrate, wherein the polarizing light-emitting layer has an electroluminescence mode and the polarizing light-emitting layer is disposed between the first substrate and the plurality of switch elements;
   a plurality of pixel electrodes connected to the switch elements;
   a transparent electrode;
an insulating protection layer disposed between the pixel electrode and the transparent electrode;
   a color filter substrate disposed parallel to the array substrate; and
   liquid crystals filling the space between the color filter substrate and the array substrate.

\* \* \* \* \*